United States Patent
Meier et al.

(10) Patent No.: US 7,626,824 B2
(45) Date of Patent: Dec. 1, 2009

(54) SWITCHING DEVICE WITH TWO CONTROLLED PHASES

(75) Inventors: Markus Meier, Rieden (DE); Johann Seitz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/213,654

(22) Filed: Jun. 23, 2008

(65) Prior Publication Data
US 2009/0016026 A1 Jan. 15, 2009

(30) Foreign Application Priority Data
Jun. 29, 2007 (EP) .................. 07012786

(51) Int. Cl.
*H05K 7/20* (2006.01)
(52) U.S. Cl. .................. 361/721; 361/704; 361/719; 361/720; 165/80.3
(58) Field of Classification Search .................. None
See application file for complete search history.

(56) References Cited

U.S. PATENT DOCUMENTS

| | | | | |
|---|---|---|---|---|
| 6,049,459 A | | 4/2000 | Edmonds et al. | |
| 6,195,257 B1 | * | 2/2001 | Janicek et al. | 361/704 |
| 6,201,699 B1 | * | 3/2001 | Ayres et al. | 361/707 |
| 6,310,776 B1 | * | 10/2001 | Byrne et al. | 361/707 |
| 7,274,569 B2 | * | 9/2007 | Sonoda | 361/714 |
| 7,289,327 B2 | * | 10/2007 | Goodwin et al. | 361/701 |
| 7,423,885 B2 | * | 9/2008 | Cady et al. | 361/803 |
| 2005/0088831 A1 | | 4/2005 | Lin | |
| 2005/0280998 A1 | | 12/2005 | Lin et al. | |

\* cited by examiner

*Primary Examiner*—Boris L Chervinsky
(74) *Attorney, Agent, or Firm*—Harness, Dickey & Pierce, P.L.C.

(57) ABSTRACT

In a switching device with two controlled phases, in which each phase is associated with a respective printed circuit board assembly with at least one component to be cooled on a heat sink, the heat sink has a T-shaped cross section transversely with respect to its extent direction. In at least one embodiment, the printed circuit board assemblies are arranged on both sides of the center limb of the heat sink, with the components of the two printed circuit board assemblies facing one another and resting on in each case one side of the center limb.

16 Claims, 2 Drawing Sheets

SWITCHING DEVICE WITH TWO CONTROLLED PHASES

PRIORITY STATEMENT

The present application hereby claims priority under 35 U.S.C. §119 on European patent application number EP07012786 filed Jun. 29, 2007, the entire contents of which is hereby incorporated herein by reference.

FIELD

Embodiments of the invention generally relate to a switching device with two controlled phases.

BACKGROUND

Electronic switching devices are generally connected upstream of electrical loads, for example upstream of a 3-pole motor load. Switching devices such as these in this case have three or else only two actually switched, that is to say controlled, phases. In this case, switching devices with two switched phases represent a technically financial optimum and are therefore enjoying increasing popularity on the market.

Each controlled phase in an electronic switching device is switched in its own right by at least one component, generally a power semiconductor. Components such as these produce heat losses which are often significant and must be dissipated via a heat sink. In many applications, it is also worthwhile and known for the component or the power semiconductor to be bridged in its permanently switched-on ON state by a mechanical switching element, so that the current flow is passed via the mechanical switching element and no longer via the power semiconductor. A so-called bypass circuit such as this makes it possible to drastically reduce the heat losses from a power semiconductor in the permanently switched-on state. Switching devices such as these therefore have a pairing comprising the semiconductor switching element and a mechanical switching element for each electrical phase.

Since switching devices are generally designed for high power levels, that is to say high voltages and currents, the individual phases must be arranged such that they are electrically isolated from one another. For this purpose, geometric separations must be complied with, which are dependent on the magnitude of the voltages carried by the phases. The higher the voltage, the greater the corresponding separation must be. For relatively low power level electronic switching devices, that is to say for example below 22 kW the power circuits and control circuits associated with each phase are arranged on one or more printed circuit boards. The aim in this case is always to optimally utilize the printed circuit board surface area but at the same time to maintain the safety separations mentioned above. As a result of the additional requirement that the semiconductor switching element must still additionally be thermally linked to a heat sink, a switching device often requires a large amount of physical space.

It is already known for a single heat sink to be provided for a switching device, and for all the semiconductor switches to be linked on one side to the heat sink. In this case as well, the isolation separations must be taken into account not only between the control circuits and load circuits but also between the corresponding individual phases, on the printed circuit boards to which the semiconductor switching elements are fitted. Switching devices such as these occupy a correspondingly large amount of space.

It is also known for each power section, which in each case corresponds to a single phase, to be arranged on a separate printed circuit board, for all the mechanical bridging switching elements to be arranged on a further printed circuit board, and for these four individual printed circuit boards to be connected to one another by soldering, together with a fifth printed circuit board which contains the control circuits. A design such as this is highly complex and results in additional connection and isolation parts.

SUMMARY

In at least one embodiment of the present invention, a better switching device is specified with two controlled phases.

In at least one embodiment, a switching device includes two controlled phases, in which each phase is associated with a respective separate printed circuit board assembly. Each printed circuit board assembly in this case contains at least one component to be cooled on a heat sink. The heat sink extends along one extent direction in the switching device and has a T-shaped cross section transversely with respect to this extent direction. The printed circuit board assemblies are arranged on both sides of the center limb of the heat sink, with the components to be cooled facing one another and resting on in each case one side of the center limb.

In other words, the design of the switching device according to at least one embodiment of the invention is characterized in that the two phases of a switching device in which two phases are controlled are each split between a corresponding printed circuit board assembly, with these printed circuit board assemblies being opposite one another. At least the components to be cooled in this case face one another, that is to say that side of the printed circuit board assembly to which the component is fitted in each case faces the other printed circuit board assembly. The printed circuit board assemblies and the components associated with the various phases therefore in other words at least partially enclose the limb of the heat sink between them. Each printed circuit board assembly is therefore in each case fitted with a single phase, or at least the load current path associated with the corresponding phase.

The switching device has a space-saving and compact design. This is because, for example, there is only a single phase within a single printed circuit board assembly, therefore avoiding geometric separations between two separate phases on a single printed circuit board or card. The switching device design is clearly structured, and the phases are correspondingly separated. The clear design results in simpler assembly and a reduction in the possibility of faults or errors.

The heat sink may be longer in the extent direction than a single component, and the components of the two printed circuit board assemblies are arranged such that they are not coincident with respect to the center limb in the extent direction. Seen in the extent direction, each component therefore makes contact only in its own section of the heat sink, which means that the introduction of heat into the heat sink and the dissipation of heat from the component to the entire heat sink is distributed uniformly and is efficient.

The contact connections for the phases via which the switching device is externally wired may be arranged at the ends of the printed circuit board assemblies in the extent direction of the heat sink. This makes it possible to use contact connections simply, which can be fitted directly, for example by soldering, into the printed circuit board assemblies. A correspondingly symmetrical design means, for example, that only two types of connecting parts are required, in each case for one of the printed circuit board assemblies. The main connections, that is to say the electrical contact of the corresponding connections of the individual phases, can therefore be provided using a small number of standard elements.

In particular, the contact connections for the phases, in the case of a single printed circuit board assembly, can each be arranged at both ends at the ends, in the extent direction of the heat sink. The switching device or the printed circuit board assembly can then be connected at both ends along the extent direction, thus leading to particularly clear subsequent wiring as well as to simple line routing in the switching device and the printed circuit board assemblies. In this case as well, only, for example, two different connecting elements need be kept available for both sides of the printed circuit board assembly.

The switching device with two controlled phases can easily be designed for three phases when a conductor which is arranged between the printed circuit board assemblies and runs in the extent direction of the heat sink is introduced for a further phase.

Since there is generally a need for the individual printed circuit board assemblies to communicate electrically with one another, a connection part which runs transversely with respect to the extent direction of the heat sink can be provided for making electrical contact with the printed circuit board assemblies.

This may be a plug connector. The plug connector has the advantage that it can be designed to be particularly simple. During assembly of the switching device, the printed circuit board assemblies can each be moved to the heat sink from the lateral direction, in order to place the components on it and in the process to automatically connect the plug connector between the two printed circuit board assemblies.

The connection part may also be an additional printed circuit board. This has the advantage that additional electrical components, for example control logic or an adjustment potentiometer for the switching device, can be accommodated on it, and are then particularly easily accessible, for example as a switch or the like.

The components may be prestressed against the heat sink. This ensures particularly good thermal conductivity between the component and the heat sink. The prestressing can be provided in various ways, for example by way of a clamp surrounding the switching device. This results in the entire switching device being mechanically robust.

The component itself may also be attached to the heat sink, in order to prestress the component with respect to the heat sink. Since the component is itself generally fixed firmly in the printed circuit board in the printed circuit board assembly, for example by being firmly soldered in it, this also results in the printed circuit board assemblies automatically being fixed to the heat sink, and therefore in the switching device being mechanically robust. The screw connection which is provided, for example, on both sides of the heat sink makes the switching device robust, therefore simplifying handling during assembly.

BRIEF DESCRIPTION OF THE DRAWINGS

Reference is made to the example embodiments in the drawings for a further description of the invention. In the figures, in each case illustrated in the form of a highly simplified schematic outline sketch.

DETAILED DESCRIPTION OF THE EXAMPLE EMBODIMENTS

Figure 2:
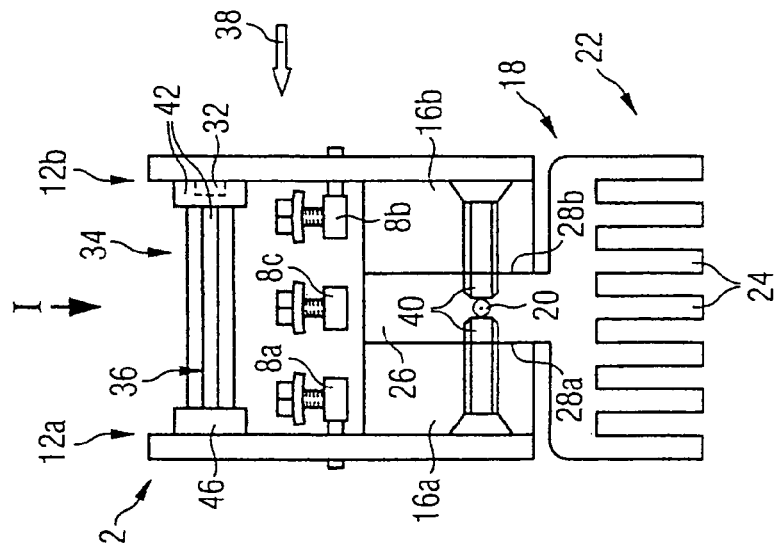
FIG. 2 shows a front view of the switching device shown in FIG. 1.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Figure 1:
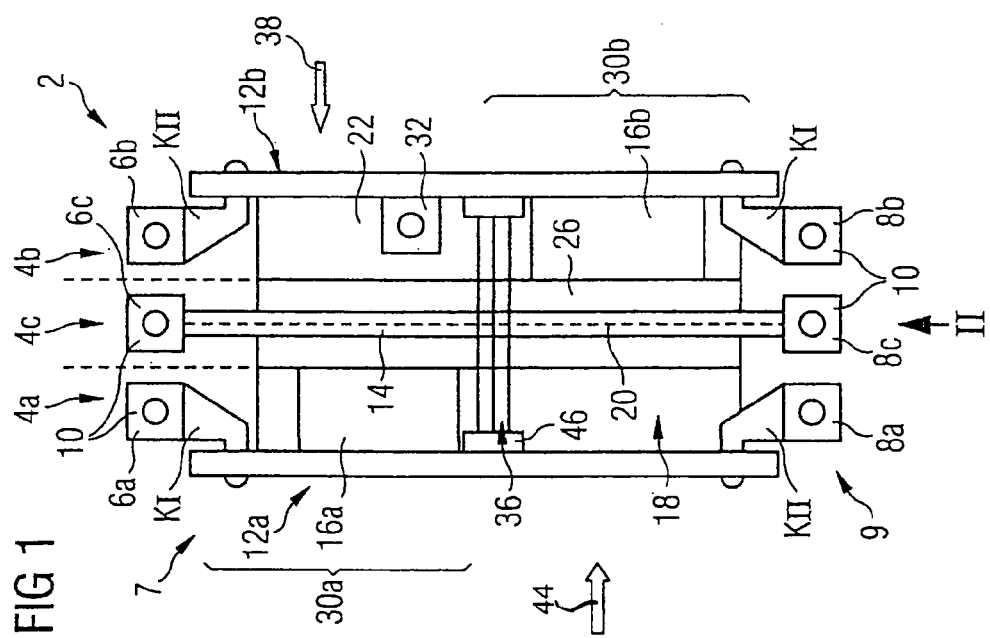
FIG. 1 shows a plan view of a switching device according to an embodiment of the invention.

Looking in the direction of the arrows I, II, FIGS. 1 and 2 show a switching device 2 with three phases 4a-c, which have a respective input 6a-c and output 8a-c, and can be connected there via corresponding connecting terminals 10 on the face 7 of the switching device 2 to a voltage supply, which is not illustrated, and on the face 9 to an electrical load. The phases 4a,b are switched or controlled phases. The relevant connecting terminals 10 therefore each lead to a printed circuit board assembly 12a,b, which appropriately influence the voltages and currents fed in at the relevant input 6a,b, in order to make them available in a regulated form at the outputs 8a,b. The phase 4c is unswitched, and the input 6c is therefore directly connected to the output 8c via a continuous conductor track 14, in the example a simple stamped part. Because of the symmetrical design of the printed circuit board assemblies 12a,b, only two types KI and KII of connecting terminals 10 are required.

In order to control the phases 4a,b, a semiconductor 16a,b in the form of a power semiconductor switch is in each case arranged on each printed circuit board assembly 12a,b. During operation of the switching device 2, the semiconductors 16a,b produce large heat losses which must be dissipated. The switching device 2 therefore contains a heat sink 18 which has an extent direction, indicated by the line 20, along the switching device 2. The heat sink 18 has a T-shaped cross section. On its lateral part 22, the heat sink 18 has cooling ribs 24, and the limb 26 of the heat sink extends away from the lateral part 22.

The printed circuit board assemblies 12a,b are arranged parallel to one another and at least partially enclose the limb 26 between them. At least the semiconductors 16a,b are fitted to the printed circuit board assemblies 12a,b such that they face one another. The semiconductor 16a therefore rests on one face 28a, and the semiconductor 16b on the other face 28b, of the limb 26. In contrast, the semiconductors 16a,b are arranged such that they are not coincident in the extent direction 20 of the heat sink 18, specifically with the semiconductor 16a in a longitudinal section 30a, and with the semiconductor 16b in a longitudinal section 30b of the heat sink 18.

A potentiometer 32 is also arranged on the printed circuit board assembly 12b, and is used to adjust parameters of the switching device 2 which are not specified in any more detail. The fact that the switching device 2 is open towards the upper face 34 makes it easily accessible from there. The potentiometer 32 is represented by dashed lines in FIG. 2 since it is concealed by a connecting plug 36 which electrically connects the printed circuit board assemblies 12a,b to one another, for example for communication between them.

In order to assemble the switching device 2, the phase 4c or the corresponding conductor track 14 is first of all attached to the heat sink 18 in a manner which is not illustrated in FIG. 1 or 2. The printed circuit board assembly 12b is then moved towards the heat sink 18 in the direction of the arrow 38 until the semiconductor 16b rests on the limb 26. The semiconductor 16b is then screwed to the heat sink 18 by way of a screw 40 which engages in the semiconductor 16b. Since the semiconductor 16b is soldered into the printed circuit board assembly 12 by way of solid contacts, the entire printed circuit board assembly 12b is therefore mounted in a mechanically robust manner on the heat sink 18. The printed circuit board assembly 12b is associated with a plug part 42 of the connecting plug 36, and is soldered to it.

The printed circuit board assembly 12a is then fitted in a corresponding manner to the heat sink 18 from the other side in the direction of the arrow 44, and the semiconductor 16a is attached by way of a further screw 40. During this process, a socket 46, which is fitted on the printed circuit board assembly 12a, on the connecting plug 36 latches into the plug part 42, thus making the electrical connection between the printed circuit board assemblies 12a,b. The screw connection by way of the screws 40 results in the semiconductors 16a,b being mechanical prestressed with respect to the faces 28a,b of the heat sink 18, thus ensuring good thermal conduction.

Figure 3:
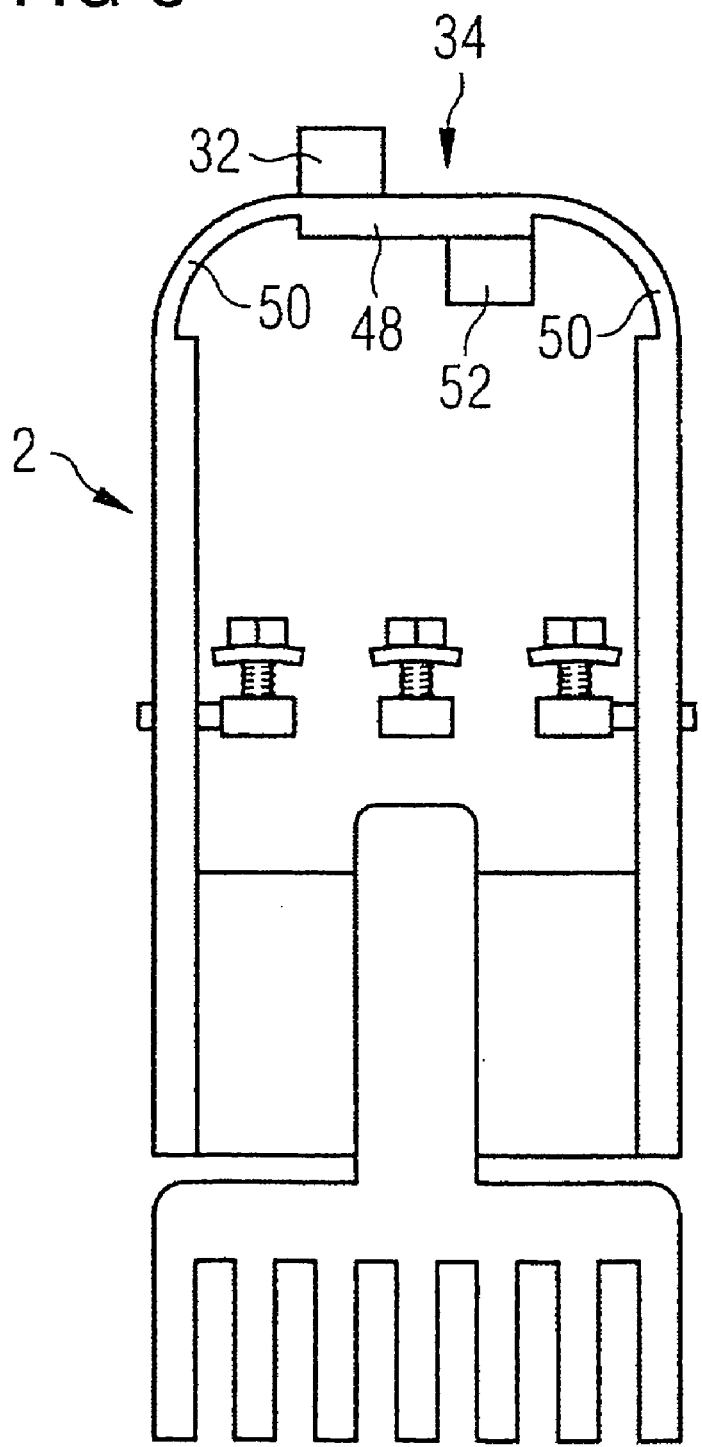
FIG. 3 shows an alternative embodiment of the switching device with a connection printed circuit board, illustrated as shown in FIG. 2.

FIG. 3 shows an alternative embodiment of a switching device 2, in which the connecting plug 36 is replaced by a printed circuit board 48 which is connected to each of the two printed circuit board assemblies 12a,b by way of flexible connecting lines 50. Since the printed circuit board 48 additionally offers space for positioning of components both the potentiometer 32 and additional logic modules 52 are arranged on the printed circuit board 48. Additional functionality is therefore provided in the same physical space as in the case of the switching device 2 shown in FIGS. 1 and 2, by virtue of the larger printed circuit board surface area that is available. The potentiometer 32 can be accessed even better on the upper face 34 of the switching device 2 than in the embodiment shown in FIGS. 1 and 2.

The switching device according to an embodiment of the invention also has (not illustrated) three-phase current detection for an overload relay function, thermistor protection and a fault output relay, is designed for currents of 38A, and its dimensions are 45 mm×125 mm×153 mm.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A switching device including two controlled phases, in which each phase is associated with a respective printed circuit board assembly with at least one component to be cooled on a heat sink, the heat sink having a T-shaped cross section transversely with respect to its extent direction, wherein the printed circuit board assemblies are arranged on both sides of a center limb of the heat sink, with the components of the two printed circuit board assemblies facing one another with each resting on one side of the center limb.

2. The switching device as claimed in claim 1, wherein the heat sink is longer in the extent direction than the component, and wherein the components of the two printed circuit board assemblies are arranged such that they are not coincident with respect to the center limb in the extent direction.

3. The switching device as claimed in claim 1, wherein contact connections are included for the phases, the contact connections being arranged at the ends of the printed circuit board assemblies in the extent direction of the heat sink.

4. The switching device as claimed in claim 3, wherein each printed circuit board assembly includes a contact connection for the phase at both ends, at the ends, in the extent direction of the heat sink.

5. The switching device according to claim 1, further comprising a conductor for a further phase, the conductor being arranged between the printed circuit board assemblies and running in the extent direction of the heat sink.

6. The switching device as claimed in claim 1, further comprising a connection part which runs transversely with respect to the extent direction of the heat sink, for making electrical contact with the printed circuit board assemblies.

7. The switching device as claimed in claim 6, wherein the connection part is a plug connector.

8. The switching device as claimed in claim 6, wherein the connection part is a printed circuit board.

9. The switching device as claimed in claim 1, wherein the components are prestressed against the heat sink.

10. The switching device as claimed in claim 9, wherein the components are attached to the heat sink.

11. The switching device as claimed in claim 2, wherein contact connections are included for the phases, the contact connections being arranged at the ends of the printed circuit board assemblies in the extent direction of the heat sink.

12. The switching device as claimed in claim 11, wherein each printed circuit board assembly includes a contact connection for the phase at both ends, at the ends, in the extent direction of the heat sink.

13. The switching device according to claim 2, further comprising a conductor for a further phase, the conductor being arranged between the printed circuit board assemblies and running in the extent direction of the heat sink.

14. The switching device as claimed in claim 2, further comprising a connection part which runs transversely with respect to the extent direction of the heat sink, for making electrical contact with the printed circuit board assemblies.

15. The switching device as claimed in claim 2, wherein the components are prestressed against the heat sink.

16. The switching device as claimed in claim 15, wherein the components are attached to the heat sink.

* * * * *